United States Patent
Park et al.

(10) Patent No.: US 9,734,929 B2
(45) Date of Patent: Aug. 15, 2017

(54) COMPOSITION FOR FORMING SOLAR CELL ELECTRODE AND ELECTRODE PREPARED USING THE SAME

(71) Applicant: SAMSUNG SDI CO., LTD., Yongin-si, Gyeonggi-do (KR)

(72) Inventors: Sang Hee Park, Uiwang-si (KR); Hyun Jin Koo, Uiwang-si (KR); Dae Sub Song, Uiwang-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/712,719

(22) Filed: May 14, 2015

(65) Prior Publication Data

US 2015/0333198 A1 Nov. 19, 2015

(30) Foreign Application Priority Data

May 15, 2014 (KR) .................... 10-2014-0058608
Apr. 16, 2015 (KR) .................... 10-2015-0054044

(51) Int. Cl.
*H01L 21/00* (2006.01)
*H01B 1/22* (2006.01)
(Continued)

(52) U.S. Cl.
CPC .............. *H01B 1/22* (2013.01); *C03C 3/062* (2013.01); *C03C 3/07* (2013.01); *C03C 3/11* (2013.01);
(Continued)

(58) Field of Classification Search
CPC ......... H01L 31/022425; H01L 31/1864; H01L 31/0224; C09D 5/24; H01B 1/22;
(Continued)

(56) References Cited

U.S. PATENT DOCUMENTS

2010/0034693 A1* 2/2010 Li .................... B22F 1/0018
  420/501
2013/0037761 A1* 2/2013 Hang ...................... H01B 1/22
  252/514
(Continued)

FOREIGN PATENT DOCUMENTS

CN 101843201 A 2/2010
CN 102081986 A 6/2011
(Continued)

OTHER PUBLICATIONS

Chinese Office Action dated Jul. 27, 2016 in Corresponding Chinese Patent Application No. 201510246121.9.
(Continued)

*Primary Examiner* — Xinning Niu
*Assistant Examiner* — Vu A Vu
(74) *Attorney, Agent, or Firm* — Lee & Morse, P.C.

(57) ABSTRACT

Example embodiments relate to a composition for forming a solar cell electrode, and a solar cell electrode prepared using the composition. The composition for forming a solar cell electrode includes a silver (Ag) powder, a glass frit, and an organic vehicle, wherein the glass frit includes silver (Ag); tellurium (Te); and at least one selected from the group of lithium (Li), sodium (Na), and potassium (K), a molar ratio of the silver (Ag):the tellurium (Te) included in the glass frit is in a range of about 1:0.1 to about 1:50, and a molar ratio of the silver (Ag):lithium (Li), sodium (Na) or potassium (K) is in a range of about 1:0.01 to about 1:10. The solar cell electrode prepared using the composition has excellent fill factor and conversion efficiency due to minimized contact resistance (Rc) and series resistance (Rs).

14 Claims, 1 Drawing Sheet

(51) Int. Cl.
  *H01L 31/0224* (2006.01)
  *C09D 5/24* (2006.01)
  *H01L 31/18* (2006.01)
  *C03C 3/062* (2006.01)
  *C03C 3/07* (2006.01)
  *C03C 3/11* (2006.01)
  *C03C 3/12* (2006.01)
  *C03C 3/16* (2006.01)
  *C03C 3/23* (2006.01)
  *C03C 8/02* (2006.01)
  *C03C 8/08* (2006.01)
  *C03C 8/10* (2006.01)
  *C03C 8/18* (2006.01)

(52) U.S. Cl.
  CPC ............... *C03C 3/122* (2013.01); *C03C 3/16* (2013.01); *C03C 3/23* (2013.01); *C03C 8/02* (2013.01); *C03C 8/08* (2013.01); *C03C 8/10* (2013.01); *C03C 8/18* (2013.01); *C09D 5/24* (2013.01); *H01L 31/022425* (2013.01); *H01L 31/1864* (2013.01); *Y02E 10/50* (2013.01)

(58) Field of Classification Search
  CPC .... C03C 8/10; C03C 3/16; C03C 3/07; C03C 8/02; C03C 3/122; C03C 3/11; C03C 8/08; C03C 3/062; C03C 8/18; C03C 3/23; Y02P 70/521
  USPC .......................................................... 438/98
  See application file for complete search history.

(56) References Cited

U.S. PATENT DOCUMENTS

2013/0220684 A1* 8/2013 Shipway .............. C09D 11/037
                                                    174/257
2015/0115207 A1* 4/2015 Shih ......................... H01B 1/16
                                                    252/514
2015/0191609 A1* 7/2015 Park .................... H01L 31/0224
                                                    252/514

FOREIGN PATENT DOCUMENTS

| CN | 102403214 A | 4/2012 |
| CN | 102476919 A | 5/2012 |
| CN | 102971268 A | 3/2013 |
| TW | 201349257 A | 12/2013 |

OTHER PUBLICATIONS

Taiwanese Office Action issued on Jun. 7, 2016 in corresponding Taiwanese Patent Application No. 104115478. (Sang Hee Park, et al.).

* cited by examiner

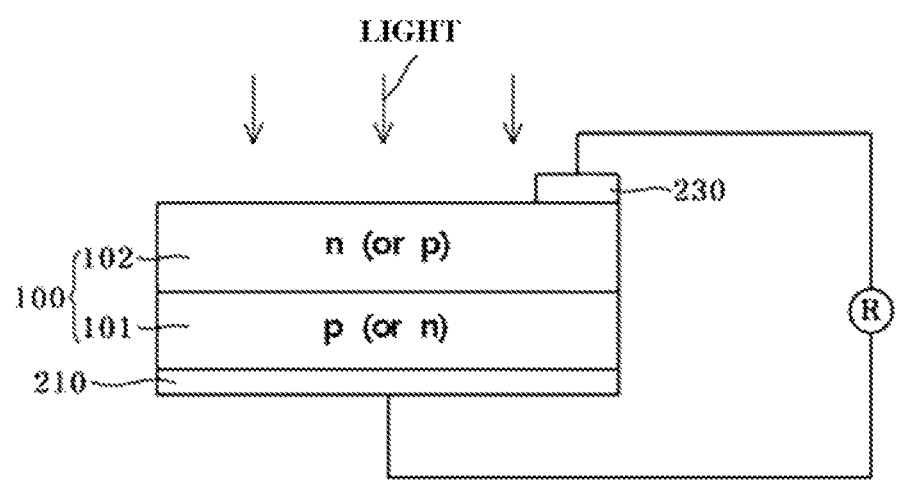

COMPOSITION FOR FORMING SOLAR CELL ELECTRODE AND ELECTRODE PREPARED USING THE SAME

CROSS-REFERENCE TO RELATED APPLICATIONS

Korean Patent Application No. 10-2014-0058608, filed on May 15, 2014, in the Korean Intellectual Property Office, and Korean Patent Application No. 10-2015-0054044, filed on Apr. 16, 2015, in the Korean Intellectual Property Office, and entitled: "Composition for Forming Solar Cell Electrode and Electrode Prepared Using the Same," are incorporated by reference herein in their entirety.

BACKGROUND

1. Field

Embodiments relate to a composition for forming a solar cell electrode and an electrode prepared using the same.

2. Description of the Related Art

Solar cells convert photons of light from the sun into electrical energy using a photoelectric effect of a PN junction. For example, the solar cells may have a structure in which front electrodes and rear electrodes are formed on a semiconductor wafer or substrate having a PN junction formed thereon. In the solar cells having such a structure, the photoelectric effect is induced at the PN junction by light from the sun incident on the semiconductor wafer, and the electrons generated due to the induced photoelectric effect flows outside through the electrodes.

SUMMARY

Embodiments are directed to a composition for forming a solar cell electrode, the composition including a silver powder, a glass frit, and an organic vehicle. The glass frit may include silver, tellurium, and one or more of lithium, sodium, or potassium, a molar ratio of silver:tellurium in the glass frit may be about 1:0.1 to about 1:50, and a molar ratio of silver:lithium, sodium, or potassium in the glass frit may be about 1:0.01 to about 1:10.

The glass fit may further include one or more of lead, bismuth, phosphorus, germanium, gallium, cerium, iron, silicon, zinc, tungsten, magnesium, cesium, strontium, molybdenum, titanium, tin, indium, vanadium, ruthenium, barium, nickel, copper, arsenic, cobalt, zirconium, manganese, neodymium, chromium, antimony, or aluminum.

The glass fit may include silver at about 0.1 mol % to about 65 mol %, based on the total moles of the glass fit.

Silver in the glass frit may be formed from a silver compound having an ionic dissociation temperature of about 1,100° C. or less.

The silver compound may include one or more of silver cyanide, silver nitrate, a silver halide, silver carbonate, silver acetate, silver sulfate, or silver oxide.

The glass frit may be formed from a metal precursor that includes a silver compound, tellurium oxide, and a compound including one or more of lithium, sodium, or potassium.

The metal precursor may further include one or more of lead oxide, bismuth oxide, phosphorus oxide, germanium oxide, gallium oxide, cerium oxide, iron oxide, silicon oxide, zinc oxide, tungsten oxide, magnesium oxide, cesium oxide, strontium oxide, molybdenum oxide, titanium oxide, tin oxide, indium oxide, vanadium oxide, ruthenium oxide, barium oxide, nickel oxide, copper oxide, arsenic oxide, cobalt oxide, zirconium oxide, manganese oxide, neodymium oxide, chromium oxide, antimony oxide, or aluminum oxide.

The metal precursor may include about 1 wt % to about 45 wt % of the silver compound, about 20 wt % to about 75 wt % of the tellurium oxide, and about 1 wt % to about 35 wt % of the compound including one or more of lithium, sodium, or potassium.

The metal precursor may include about 1 wt % to about 40 wt % of the one or more of lead oxide, bismuth oxide, phosphorus oxide, germanium oxide, gallium oxide, cerium oxide, iron oxide, silicon oxide, zinc oxide, tungsten oxide, magnesium oxide, cesium oxide, strontium oxide, molybdenum oxide, titanium oxide, tin oxide, indium oxide, vanadium oxide, ruthenium oxide, barium oxide, nickel oxide, copper oxide, arsenic oxide, cobalt oxide, zirconium oxide, manganese oxide, neodymium oxide, chromium oxide, antimony oxide, or aluminum oxide.

The composition may include about 60 wt % to about 95 wt % of the silver powder, about 0.1 wt % to about 20 wt % of the glass fit, and about 1 wt % to about 30 wt % of the organic vehicle.

The glass fit may have an average particle size (D50) of about 0.1 μm to about 10 μm.

The composition may further include one or more of a dispersing agent, a thixotropic agent, a plasticizing agent, a viscosity stabilizing agent, an antifoaming agent, a pigment, a UV stabilizer, an antioxidant, or a coupling agent.

Embodiments are also directed to a solar cell electrode prepared using the composition according to an embodiment.

Embodiments are also directed to a method of fabricating a solar cell, the method including applying the composition according to an embodiment on a substrate for a solar cell, and forming a solar cell electrode on the substrate, forming the solar cell electrode including firing the substrate having the composition applied thereon.

BRIEF DESCRIPTION OF THE DRAWINGS

Features will become apparent to those of skill in the art by describing in detail exemplary embodiments with reference to the attached drawing in which:

FIG. 1 illustrates a schematic diagram showing a structure of a solar cell according to an example embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to likes throughout.

Composition for Forming a Solar Cell Electrode

An example embodiment is related to a composition for forming a solar cell electrode (herein simply referred to as a "composition"). The composition for forming a solar cell electrode according to an example embodiment includes a silver (Ag) powder, a glass frit, and an organic vehicle. The glass frit includes silver (Ag), tellurium (Te), and an element of group 1A of the periodic table. In this case, the group 1A element includes at least one selected from the group of lithium (Li), sodium (Na), and potassium (K). A molar ratio of the silver (Ag) to the tellurium (Te) included in the glass frit is in a range of about 1:0.1 to about 1:50, and a molar ratio of the silver (Ag) to the lithium (Li), sodium (Na), or potassium (K) is in a range of about 1:0.01 to about 1:10.

In this specification, the term "molar ratio" refers to a molar ratio to atoms of each metal. Hereinafter, embodiments will be described in further detail, as follows.

(A) Silver Powder

In the composition for forming a solar cell electrode according to an example embodiment, the silver (Ag) powder is used as a conductive powder. The silver powder may be a powder having a nano- or micro-scaled particle size. For example, the silver powder may be a silver powder having a particle size of several ten to several hundred nanometers, or a silver powder having a particle size of several to several ten nanometers. Also, a mixture of two silver powders having different particle sizes may be used.

The particle shape of the silver powder may, for example, be spherical, sheet-like, amorphous, etc.

The silver powder may have an average particle size (D50) of, for example, about 0.1 μm to about 10 or about 0.5 μm to about 5 μm. Within this particle size range, an effect of reducing contact resistance and linear resistance may be accomplished.

The average particle size is measured using a particle size analyzer (model: 1064LD manufactured by CILAS Co., Ltd.) after a conductive powder is dispersed in isopropyl alcohol (IPA) at 25° C. for 3 minutes using ultrasonic waves.

The silver powder may be included at a content of about 60 wt % (weight %) to about 95 wt %, based on the total weight of the composition for forming a solar cell electrode. Within this content range, an effect of improving conversion efficiency, and an effect favorable for pasting may be realized. For example, the silver powder may be included at a content of about 70 wt % to about 90 wt %, based on the total weight of the composition for forming a solar cell electrode.

(B) Glass Frit

A glass frit may generate silver crystal particles at an emitter region to reduce resistance by etching an antireflective layer during a process of baking the composition for forming a solar cell electrode. Also, the glass frit has effects of improving adhesion between a conductive powder and a wafer and further reducing a baking temperature by softening the composition upon sintering.

An increase in area of a solar cell may result in an increase in contact resistance of the solar cell. Therefore, the damage of a PN junction caused by the increase in area of the solar cell should be minimized, and the series resistance should be minimized as well. Also, the glass frit should sufficiently ensure thermal stability even in a wide range of baking temperatures.

The glass fit according to an example embodiment may be formed from a metal precursor including a silver (Ag) compound; tellurium (Te) oxide; and a compound including an of group 1A of the periodic table.

In this case, the compound including the of the group 1A of the periodic table may be a lithium (Li) compound, a sodium (Na) compound, a potassium (K) compound, or a mixture thereof.

For example, the glass frit according to an example embodiment may be prepared by melting and grinding a metal precursor obtained by mixing the silver (Ag) compound; the tellurium (Te) oxide; and the lithium (Li) compound, the sodium (Na) compound, the potassium (K) compound or the mixture thereof. As a result, the glass frit according to an example embodiment includes silver (Ag); tellurium (Te); and at least one of the group 1A of the periodic table selected from the group of lithium (Li), sodium (Na), and potassium (K).

The silver (Ag) compound may be decomposed into silver (Ag) ions at a temperature of 1,100° C. or less. The silver (Ag) compound having a decomposition temperature in this range may be used to improve contact characteristics with electrodes and wafers.

For example, the silver compound may be an ionic-bonded compound. For example, silver cyanide (AgCN), silver nitrate ($AgNO_3$), a silver halide (AgX (where X is halide)), silver carbonate ($Ag_2CO_3$), silver acetate ($AgC_2H_3O_2$), silver sulfate ($Ag_2SO_4$), and silver oxide ($Ag_2O$) may be used alone or in combination. In the silver halide (Ag—X), X may be iodine, fluorine, chlorine, or bromine.

The silver derived from the above-described silver compound and present in the glass fit may adjust conductivity of glass at the interface of the electrodes formed in the order of silver crystals, a glass and a wafer. Also, the silver derived from the silver compound has an excellent effect in filling enclosed pores or voids formed on the glass frit. In such a case, the glass frit may reduce contact resistance and series resistance to wafers and electrodes.

After the solar cell electrode prepared from the composition according to an example embodiment is baked, silver crystals may precipitate on the glass frit. In this case, the further precipitating silver crystals refer to silver crystals in addition of the silver (Ag) crystals formed of a conductive powder after baking. Also, the silver present in the glass frit derived from the above-described silver compound confers conductivity on a glass at the interface of the electrodes formed in the order of silver crystals, a glass and a wafer, and may fill enclosed pores or voids formed on the glass frit. The glass serves as an insulator between the silver crystals and the wafer. In this case, the silver present in the glass frit may reduce contact resistance and series resistance to wafer-silver electrodes.

The tellurium oxide may, for example, tellurium monoxide, tellurium dioxide, tellurium trioxide, etc.

The lithium compound may, for example, lithium carbonate. However, a cyanate, nitrate, haloid, acetate, and sulfate of lithium, lithium oxide, and the like may be used.

The sodium compound may, for example, sodium carbonate. However, a cyanate, nitrate, haloid, acetate, and sulfate of sodium, sodium oxide, and the like may be used.

The potassium compound may, for example, potassium carbonate. However, a cyanate, nitrate, haloid, acetate, and sulfate of potassium, potassium oxide, and the like may be used.

In an example embodiment, the metal precursor may include the silver compound at about 1 wt % to about 45 wt %, the tellurium oxide at about 20 wt % to about 75 wt %, and the compound including the of the group 1A of the periodic table at about 1 wt % to about 35 wt %.

The molar ratio of the silver (Ag) to the tellurium (Te) present in the glass frit according to an example embodiment may be in a range of about 1:0.1 to about 1:50, for example about 1:0.5 to about 1:40. When the molar ratio of Ag:Te exceeds 1:50 so that the molar ratio of Te is more than 50 times of Ag, Ag may be present in the glass at a relatively low content. Also, when the molar ratio of Te to Ag exceeds 1:0.1 so that the molar ratio of Te is less than 0.1 times of Ag, characteristics of the glass may be deteriorated.

Also, the molar ratio (Ag:Li, Ag:Na, or Ag:K) of the silver (Ag) to the lithium (Li), sodium (Na) or potassium (K)

present in glass frit may be in a range of about 1:0.01 to about 1:10, for example, about 1:0.01 to about 1:5. When the molar ratio of Ag to Li, Na, or K exceeds 1:10 (the molar ratio of Li, Na, or K is more than 10 times of Ag), silver (Ag) may be present in the glass at a relatively low content. In addition, an open-circuit voltage may be reduced as lithium (Li), sodium (Na), or potassium (K) permeates into the wafer. Also, when the molar ratio of Ag to Li, Na, or K exceeds 1:0.01 so that the molar ratio of Li, Na, or K is less than 0.01 times of Ag, an insulating property of glass may be deteriorated.

The glass fit may further include one or more of lead (Pb), bismuth (Bi), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), ruthenium (Ru), barium (Ba), nickel (Ni), copper (Cu), arsenic (As), cobalt (Co), zirconium (Zr), manganese (Mn), neodymium (Nd), chromium (Cr), an antimony (Sb), and aluminum (Al). In this specification, these may be referred to as a second metal so as to differentiate from the silver, the tellurium, and group 1A element of periodic table as described above.

In this case, the glass frit may be prepared by including one or more metal oxides selected from the group of lead (Pb) oxide, bismuth (Bi) oxide, phosphorus (P) oxide, germanium (Ge) oxide, gallium (Ga) oxide, cerium (Ce) oxide, iron (Fe) oxide, silicon (Si) oxide, zinc (Zn) oxide, tungsten (W) oxide, magnesium (Mg) oxide, cesium (Cs) oxide, strontium (Sr) oxide, molybdenum (Mo) oxide, titanium (Ti) oxide, tin (Sn) oxide, indium (In) oxide, vanadium (V) oxide, ruthenium (Ru) oxide, barium (Ba) oxide, nickel (Ni) oxide, copper (Cu) oxide, arsenic (As) oxide, cobalt (Co) oxide, zirconium (Zr) oxide, manganese (Mn) oxide, neodymium (Nd) oxide, chromium (Cr) oxide, antimony (Sb) oxide, and aluminum (Al) oxide (in addition of the silver (Ag) compound, the tellurium (Te) oxide, and the of the group 1A of the periodic table as described above). In this specification, these may be referred to as a second metal oxide.

The metal precursor may further include the second metal oxide, for example, at a content of about 1 wt % to about 40 wt %.

In an example embodiment, the metal precursor may include the silver compound at about 1 wt % to about 30 wt %, the tellurium oxide at about 20 wt % to about 70 wt %, the compound including the of the group 1A of the periodic table at about 1 to about 20 wt %, and the bismuth (Bi) oxide at about 5 wt % to about 40 wt %.

In another example embodiment, the metal precursor may include the silver compound at about 1 to about 30 wt %, the tellurium oxide at about 20 to 70 wt %, the compound including the of the group 1A of the periodic table at about 1 to about 20 wt %, and the lead (Pb) oxide at about 10 wt % to about 40 wt %.

In still another example embodiment, the metal precursor may include the silver compound at about 1 to about 30 wt %, the tellurium oxide at about 20 to 70 wt %, the compound including the of the group 1A of the periodic table at about 1 to about 20 wt %, and the neodymium oxide at about 1 wt % to about 10 wt %.

The glass frit may include the silver (Ag) at about 0.1 mol % to about 65 mol %, for example, about 1 mol % to about 50 mol %, based on the total moles of the glass fit. Within this mole range, the glass frit may excellently maintain characteristics as an insulator while improving conductivity of the electrode. In an example embodiment, the glass frit may include the silver (Ag) at about 1 mol %, 2 mol %, 3 mol %, 4 mol %, 5 mol %, 6 mol %, 7 mol %, 8 mol %, 9 mol %, 10 mol %, 11 mol %, 12 mol %, 13 mol %, 14 mol %, 15 mol %, 16 mol %, 17 mol %, 18 mol %, 19 mol %, 20 mol %, 21 mol %, 22 mol %, 23 mol %, 24 mol %, 25 mol %, 26 mol %, 27 mol %, 28 mol %, 29 mol %, 30 mol %, 31 mol %, 32 mol %, 33 mol %, 34 mol %, 35 mol %, 36 mol %, 37 mol %, 38 mol %, 39 mol %, 40 mol %, 41 mol %, 42 mol %, 43 mol %, 44 mol %, 45 mol %, 46 mol %, 47 mol %, 48 mol %, 49 mol %, or 50 mol %, based on the total moles of the glass frit.

In this specification, the contents of the respective metal components included in the glass frit are measured using inductively coupled plasma-optical emission spectrometry (ICP-OES). Since the ICP-OES is performed using a very small amount of a sample, a sample preparation time may be cut. Also, the ICP-OES has advantages in that errors may be reduced by pretreatment of the sample, and it has excellent analytic sensitivity.

Specifically, the ICP-OES may include pretreating a sample, preparing a standard solution, measuring concentrations of metal components to be measured, and calculating contents of the respective metal components, based on the concentration of the metal components. In this case, the contents of the respective metal components included in the glass frit may be accurately measured.

The pretreating of the sample may include dissolving a proper amount of a sample glass frit in an acidic solution in which metal components to be analyzed in the glass frit may be dissolved, and heating the sample to carbonize the sample. Examples of the acidic solution that may be used herein include a sulfuric acid ($H_2SO_4$) solution, etc.

The carbonized sample may be properly diluted with a solvent, such as distilled water or hydrogen peroxide ($H_2O_2$), to an analytical concentration range of the metal components to be analyzed. The analytical concentration range may be used with 10,000 time dilutions in consideration of the applied detection capacity of an ICP-OES machine.

The pre-treated sample may be calibrated using a standard solution used upon measurement using the ICP-OES machine, for example, a standard solution including the metal components to be analyzed.

By way of example, a calibration curve is plotted using an external standard method by introducing the standard solution into the ICP-OES machine. Thereafter, the concentrations (ppm) of the metal components to be analyzed in the pretreated sample may be measured using the ICP-OES machine, and the contents and molar ratios of the respective metal components in the glass frit may be calculated, based on the concentrations (ppm) of the metal components.

After the solar cell electrode prepared from the glass frit according to an example embodiment is baked, silver crystals in addition of the silver (Ag) crystals formed of the conductive powder may precipitate on the glass frit.

In the composition, glass frit having an average particle size (D50) of about 0.1 μm to about 10 μm may be used. The shape of the glass frit may be either spherical or amorphous. Within this particle size range, the glass frit may have excellent effects of improving conductivity of the electrode and reducing contact resistance.

The content of the glass frit may, for example, be in a range of about 0.1 wt % to about 20 wt %, or about 0.5 wt % to about 10 wt %, based on the total weight of the composition for forming a solar cell electrode. Within this content range, the stability of the PN junction may be ensured under a wide range of sheet resistance conditions.

Within this content range, a series resistance value of the solar cell may also be minimized, and efficiency of the solar cell may be improved.

The glass frit may be prepared using a general method. For example, a metal precursor is prepared by mixing the silver (Ag) compound; the tellurium (Te) oxide; and the lithium (Li), sodium (Na), or potassium (K) compound (or the mixture thereof) at a predetermined mixing ratio. The mixing may be performed using a ball mill or a planetary mill. The prepared metal precursor may be melted at about 800° C. to about 1,300° C., and quenched at about 25° C. The resulting product may be ground, using a ball mill or a planetary mill, to obtain a glass frit.

(C) Organic Vehicle

An organic vehicle is mechanically mixed with an inorganic component of the composition for forming a solar cell electrode to confer viscosity and rheological properties suitable for printing on the composition.

An organic vehicle used in the composition for forming a solar cell electrode may be generally used as the organic vehicle. The organic vehicle may include a suitable binder resin and solvent.

An acrylate-based or cellulose-based resin may be used as the binder resin. In this case, ethyl cellulose may be used. However, ethyl hydroxyethyl cellulose, nitrocellulose, a mixture of ethyl cellulose and a phenol resin, an alkyd resin, a phenolic resin, an acrylic acid ester-based resin, a xylene-based resin, a polybutene-based resin, a polyester-based resin, a urea-based resin, a melamine-based resin, a vinyl acetate-based resin, wood rosin, or a polymethacrylate of alcohol may also be used.

For example, the solvent may include hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methyl ethyl ketone, benzyl alcohol, γ-butyrolactone, or ethyl lactate, which may be used alone or in combination of two or more.

The organic vehicle may be included at a content of about 1 wt % to about 30 wt %, based on the total weight of the composition for forming a solar cell electrode. Within this content range, sufficient adhesive strength and excellent printability may be ensured.

(D) Additive

The composition for forming a solar cell electrode according to an example embodiment may further include an additive. The additive may include a dispersing agent, a thixotropic agent, a plasticizing agent, a viscosity stabilizing agent, an antifoaming agent, a pigment, a UV stabilizer, an antioxidant, and a coupling agent, which may be used alone or in combination of two or more. In this case, the additive may further improve flow and process characteristics and stability of the composition for forming a solar cell electrode. The additive may be included at a content of about 0.1 wt % to about 5 wt %, based on the total weight of the composition for forming a solar cell electrode. In this case, the content of the additive may vary according to a desired purpose.

Solar cell electrode and solar cell including the same

Another aspect is related to an electrode formed of the composition for forming a solar cell electrode, and a solar cell including the same.

FIG. 1 is a diagram showing a structure of a solar cell according to an example embodiment.

Refrring to FIG. 1, a wafer 100 or substrate 100 includes a p layer (or an n layer) 101, and an n layer (or a p layer) 102 serving as an emitter. The composition for forming a solar cell electrode may be printed on the wafer 100 or substrate 100, and baked to form a rear electrode 210 and/or a front electrode 230.

For example, a rear surface of a wafer is coated with the composition for forming a solar cell electrode through printing, and then dried at a temperature of about 200° C. to about 400° C. for about 10 seconds to about 60 seconds to perform a process of preparing a rear electrode in advance. Also, the composition for forming a solar cell electrode is printed on a front surface of the wafer, and then dried to perform a process of preparing a front electrode in advance. Thereafter, a process of baking or firing the wafer or substrate, onto which the composition for forming a solar cell electrode is applied, at about 400° C. to about 950° C., or about 750° C. to about 950° C. for about 30 seconds to about 180 seconds may be performed to form the front and rear electrodes.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples 1 to 50 and Comparative Examples 1 to 4

Example 1

As an organic binder, 3.0 wt % of ethyl cellulose (Dow Chemical Co., STD4) was thoroughly dissolved in 6.5 wt % of a solvent, butyl carbitol, at 60° C., and 86.90 wt % of spherical silver powder (Dowa Hightech Co. Ltd., AG-4-8) having an average particle size of 2.0 μm, 3.1 wt % of a glass fit using silver carbonate ($Ag_2CO_3$, Acros Organics) as a silver compound and prepared using compositions listed in the following Table 1, 0.2 wt % of a dispersing agent BYK102 (BYK-Chemie) as an additive, and 0.3 wt % of a thixotropic agent Thixatrol ST (Elementis Co.) were added, and homogenously mixed, and then dispersed using a 3-roll kneader to prepare a composition for forming a solar cell electrode.

Examples 2 to 9

Compositions for forming a solar cell electrode were prepared in the same manner as in Example 1, except that glass frits prepared using the compositions listed in the following Table 1 were used.

Examples 10 to 15

Compositions for forming a solar cell electrode were prepared in the same manner as in Example 1, except that silver iodide (AgI, Sigma-Aldrich) was used as the silver compound, and glass frits prepared using the compositions listed in the following Table 2 were used.

Examples 16 to 24

Compositions for forming a solar cell electrode were prepared in the same manner as in Example 1, except that silver nitrate ($AgNO_3$, Daejung Chemicals & Metals Co., Ltd.) was used as the silver compound, and glass frits prepared using the compositions listed in the following Table 3 were used.

Examples 25 to 33

Compositions for forming a solar cell electrode were prepared in the same manner as in Example 1, except that Compositions for forming a solar cell electrode were prepared in the same manner as in Example 1, except that silver oxide ($Ag_2O$, Acros Organics) was used as the silver compound, and glass fits prepared using the compositions listed in the following Table 4 were used.

Comparative Examples 1 to 2

Compositions for forming a solar cell electrode were prepared in the same manner as in Example 1, except that glass frits prepared using the compositions listed in the following Table 5 were used.

Measurement of molar ratios of Ag:Te, Ag:Li, Ag:Na and Ag:K in glass frits using inductively coupled plasma-optical emission spectrometry (ICP-OES)

Pretreatment of sample: 0.5 g of a glass frit as a sample to be analyzed was put into a beaker, accurately weighed to units of 0.0001 g. 5 ml of sulfuric acid ($H_2SO_4$) was added to the beaker containing the sample, and then heated at 220° C. for 3 hours using a hot plate to carbonize the sample completely. Hydrogen peroxide ($H_2O_2$) was added until the beaker containing the carbonized sample become clear. Then, the pretreatment was completed.

Preparation of standard solution; Standard solutions containing metal components to be analyzed were prepared.

Measurement of molar ratios of metal components: Nitric acid ($HNO_3$) was added to the beaker containing the pretreated sample, heated for 5 minutes, and then cooled in the air. The resulting standard solution was introduced into an ICP-OES machine (PerkinElmer, Inc.) to plot a calibration curve using an external standard method. Thereafter, the concentrations (ppm) of silver (Ag), tellurium (Te), lithium (Li), sodium (Na) and potassium (K)s included in the sample were measured using the ICP-OES machine, and the molar ratios of Ag:Te and Ag:Li, Ag:Na, Ag:K in the glass frit were calculated based on the concentrations (ppm) as described above. The calculated values are listed in the following Table 6.

Contents (%) of Respective Metal Components=Elemental Concentrations (ppm) of Respective Metal Components×Dilution Factor (DF)/10,000

Moles of Respective Metal Components=Contents of Respective Metal Component/Molecular Weights of Respective Metal Components Mole percents of Respective Metal Components (%)=Moles of Respective Metal Components/Sum of Total Moles of Metal Components

TABLE 1

Compositions of glass frit (units: wt %)

| Ex. | $Ag_2CO_3$ | PbO | $Bi_2O_3$ | $TeO_2$ | $P_2O_5$ | $Li_2CO_3$ | $Na_2CO_3$ | $K_2CO_3$ | $SiO_2$ | ZnO | $WO_3$ | $Nd_2O_3$ | MgO | SnO | SrO | $Sb_2O_3$ | $Cr_2O_3$ |
|---|---|---|---|---|---|---|---|---|---|---|---|---|---|---|---|---|---|
| 1 | 5 | — | 30 | 42 | — | — | 12 | — | — | 5 | 3 | — | — | — | 3 | — | — |
| 2 | 10 | — | 30 | 42 | — | — | 5 | — | — | 10 | 3 | — | — | — | — | — | — |
| 3 | 30 | — | 20 | 32 | — | 5 | 1 | 3 | — | 2 | — | 3 | 4 | — | — | — | — |
| 4 | 5 | 32 | — | 48 | — | — | 10 | — | 2 | 3 | — | — | — | — | — | — | — |
| 5 | 10 | — | 10 | 67 | — | — | 5 | — | 3 | 5 | — | — | — | — | — | — | — |
| 6 | 27 | 20 | — | 40 | — | — | 2 | — | 5 | 3 | — | — | — | — | — | — | 3 |
| 7 | 7 | — | 14 | 47 | 3 | 3 | 8 | — | 3 | 5 | — | 2 | — | 5 | — | 3 | — |
| 8 | 14 | — | 27 | 42 | — | — | 9 | — | 3 | — | 3 | — | 2 | — | — | — | — |
| 9 | 25 | — | 20 | 37 | — | — | 11 | — | 7 | — | — | — | — | — | — | — | — |

TABLE 2

Compositions of glass frit (units: wt %)

| Ex. | AgI | PbO | $Bi_2O_3$ | $TeO_2$ | $P_2O_5$ | $Li_2CO_3$ | $Na_2CO_3$ | $K_2CO_3$ | $SiO_2$ | ZnO | $WO_3$ | $Nd_2O_3$ | MgO | SnO | SrO | $Sb_2O_3$ | $Cr_2O_3$ |
|---|---|---|---|---|---|---|---|---|---|---|---|---|---|---|---|---|---|
| 10 | 3 | 35 | — | 41 | — | 3 | — | 13 | 3 | — | — | 2 | — | — | — | — | — |
| 11 | 13 | 35 | — | 33 | — | 2 | — | 7 | 3 | 2 | — | 3 | 2 | — | — | — | — |
| 12 | 22 | 20 | — | 29 | — | 3 | — | 3 | 8 | 5 | — | 3 | 3 | 4 | — | — | — |
| 13 | 4 | 13 | — | 62 | — | 2 | 1 | 2 | — | 3 | — | 6 | — | 3 | 2 | — | 2 |
| 14 | 21 | — | 5 | 45 | 2 | 2 | — | 4 | 3 | 5 | — | 3 | 2 | 8 | — | — | — |
| 15 | 29 | 13 | — | 39 | — | 2 | — | 2 | 8 | 5 | — | 2 | — | — | — | — | — |

TABLE 3

Compositions of glass frit (units: wt %)

| Ex. | $AgNO_3$ | PbO | $Bi_2O_3$ | $TeO_2$ | $P_2O_5$ | $Li_2CO_3$ | $Na_2CO_3$ | $K_2CO_3$ | $SiO_2$ | ZnO | $WO_3$ | $Nd_2O_3$ | MgO | SnO | SrO | $Sb_2O_3$ | $Cr_2O_3$ |
|---|---|---|---|---|---|---|---|---|---|---|---|---|---|---|---|---|---|
| 16 | 5 | 38 | — | 40 | — | 12 | — | — | 2 | 3 | — | — | — | — | — | — | — |
| 17 | 15 | — | 21 | 49 | — | 10 | — | — | 2 | 3 | — | — | — | — | — | — | — |
| 18 | 30 | — | 12 | 48 | — | 1 | — | — | 5 | 4 | — | — | — | — | — | — | — |
| 19 | 3 | — | 36 | 42 | — | 9 | — | — | 2 | 5 | — | — | 3 | — | — | — | — |
| 20 | 16 | — | 21 | 42 | — | 11 | — | — | 2 | 3 | 3 | — | — | 2 | — | — | — |
| 21 | 28 | — | 18 | 32 | — | 6 | — | — | 8 | 5 | — | 3 | — | — | — | — | — |

TABLE 3-continued

Compositions of glass frit (units: wt %)

| Ex. | AgNO₃ | PbO | Bi₂O₃ | TeO₂ | P₂O₅ | Li₂CO₃ | Na₂CO₃ | K₂CO₃ | SiO₂ | ZnO | WO₃ | Nd₂O₃ | MgO | SnO | SrO | Sb₂O₃ | Cr₂O₃ |
|---|---|---|---|---|---|---|---|---|---|---|---|---|---|---|---|---|---|
| 22 | 4 | 17 | 7 | 53 | — | 13 | — | — | — | 3 | — | — | 3 | — | — | — | — |
| 23 | 16 | 19 | — | 45 | — | 7 | 3 | — | — | — | 3 | — | 2 | — | 5 | — | — |
| 24 | 31 | 16 | — | 41 | — | 9 | — | — | 3 | — | — | — | — | — | — | — | — |

TABLE 4

Compositions of glass frit (units: wt %)

| Ex. | Ag₂O | PbO | Bi₂O₃ | TeO₂ | P₂O₅ | Li₂CO₃ | Na₂CO₃ | K₂CO₃ | SiO₂ | ZnO | WO₃ | Nd₂O₃ | MgO | SnO | SrO | Sb₂O₃ | Cr₂O₃ |
|---|---|---|---|---|---|---|---|---|---|---|---|---|---|---|---|---|---|
| 25 | 4 | 8 | 30 | 43 | — | 7 | — | 2 | — | — | — | 2 | 3 | 1 | — | — | — |
| 26 | 8 | 3 | 35 | 36 | — | 5 | — | — | 3 | — | — | 3 | 5 | — | — | — | 2 |
| 27 | 11 | 14 | 17 | 29 | — | 3 | — | — | 8 | 13 | — | — | 3 | 2 | — | — | — |
| 28 | 2 | 5 | 5 | 61 | — | 14 | — | — | 3 | 4 | 2 | — | 4 | — | — | — | — |
| 29 | 5 | 32 | 13 | 37 | — | 8 | — | — | — | — | — | — | — | 5 | — | — | — |
| 30 | 10 | 30 | 12 | 21 | 2 | 6 | 3 | — | — | 5 | — | 2 | 3 | 3 | — | — | 3 |
| 31 | 5 | 2 | 35 | 47 | — | 5 | — | — | — | — | 3 | — | — | — | 3 | — | — |
| 32 | 7 | 7 | 35 | 39 | — | 7 | — | — | — | — | 3 | 2 | — | — | — | — | — |
| 33 | 12 | 22 | 13 | 34 | — | 3 | — | — | 8 | 5 | — | 3 | — | — | — | — | — |

TABLE 5

Compositions of glass frit (units: wt %)

| Comp. Ex. | AgI | PbO | Bi₂O₃ | TeO₂ | P₂O₅ | Li₂CO₃ | Na₂CO₃ | K₂CO₃ | SiO₂ | ZnO | WO₃ | Nd₂O₃ | MgO | SnO | SrO | Sb₂O₃ | Cr₂O₃ |
|---|---|---|---|---|---|---|---|---|---|---|---|---|---|---|---|---|---|
| 1 | — | — | 36 | 51 | — | 7 | — | — | 4 | — | — | 2 | — | — | — | — | — |
| 2 | 10 | — | 19 | 54 | — | — | — | — | — | 7 | — | 5 | 3 | 2 | — | — | — |

TABLE 6

| | Molar ratio | | | |
|---|---|---|---|---|
| | Te/Ag | Li/Ag | Na/Ag | K/Ag |
| Example 1 | 7.25 | — | 6.25 | — |
| Example 2 | 3.62 | — | 1.30 | — |
| Example 3 | 0.92 | 0.62 | 0.09 | 0.20 |
| Example 4 | 8.28 | — | 5.21 | — |
| Example 5 | 5.78 | — | 1.30 | — |
| Example 6 | 1.28 | — | 0.19 | — |
| Example 7 | 5.79 | 1.60 | 2.98 | — |
| Example 8 | 2.59 | — | 1.67 | — |
| Example 9 | 1.28 | — | 1.15 | — |
| Example 10 | 20.07 | 6.35 | — | 14.55 |
| Example 11 | 3.73 | 0.98 | — | 1.81 |
| Example 12 | 1.94 | 0.87 | — | 0.46 |
| Example 13 | 22.77 | 3.18 | 1.11 | 1.68 |
| Example 14 | 3.15 | 0.60 | — | 0.64 |
| Example 15 | 1.98 | 0.44 | — | 0.23 |
| Example 16 | 8.50 | 11.03 | — | — |
| Example 17 | 3.47 | 3.06 | — | — |
| Example 18 | 1.70 | 0.15 | — | — |
| Example 19 | 14.88 | 13.78 | — | — |
| Example 20 | 2.79 | 3.16 | — | — |
| Example 21 | 1.21 | 0.98 | — | — |
| Example 22 | 14.08 | 14.93 | — | — |
| Example 23 | 2.99 | 2.01 | 0.60 | — |
| Example 24 | 1.41 | 1.33 | — | — |
| Example 25 | 7.79 | 5.49 | — | 0.83 |
| Example 26 | 3.26 | 1.96 | — | — |
| Example 27 | 1.91 | 0.86 | — | — |
| Example 28 | 22.11 | 21.95 | — | — |
| Example 29 | 5.37 | 5.02 | — | — |
| Example 30 | 1.52 | 1.88 | 0.66 | — |
| Example 31 | 6.82 | 3.14 | — | — |
| Example 32 | 4.04 | 3.14 | — | — |
| Example 33 | 2.05 | 0.78 | — | — |
| Comparative Example 1 | — | — | — | — |
| Comparative Example 2 | 7.93 | — | — | — |

Method of Measuring Fill Factor and Efficiency

Each of the compositions for forming a solar cell electrode prepared in Examples and Comparative Examples was printed on a front surface of a monocrystalline wafer with a predetermined pattern through screen printing, and then dried using an infrared drying furnace. Thereafter, an aluminum paste was printed on a rear surface of the wafer, and then dried in the same manner. Cells formed during this process were baked at 700° C. to 950° C. for 30 seconds to 210 seconds using a belt-type baking furnace. The solar cells prepared thus were measured for series resistance (Rs), fill factor (FF, %), and conversion efficiency (%) using a solar cell efficiency tester (Pasan, Co., Ltd., CT-801). The measured series resistance, fill factor, and conversion efficiency values are listed in the following Tables 7 and 8.

TABLE 7

| | Series resistance (Rs; mΩ) | Fill factor (FF; %) | Conversion efficiency (%) |
|---|---|---|---|
| Example 1 | 2.579 | 78.820 | 17.752 |
| Example 2 | 2.430 | 79.203 | 17.882 |
| Example 3 | 2.244 | 79.555 | 17.971 |

TABLE 7-continued

| | Series resistance (Rs; mΩ) | Fill factor (FF; %) | Conversion efficiency (%) |
|---|---|---|---|
| Example 4 | 2.606 | 78.731 | 17.748 |
| Example 5 | 2.429 | 79.212 | 17.883 |
| Example 6 | 2.237 | 79.587 | 17.974 |
| Example 7 | 2.547 | 78.905 | 17.817 |
| Example 8 | 2.352 | 79.262 | 17.902 |
| Example 9 | 2.253 | 79.528 | 17.963 |
| Example 10 | 2.642 | 78.520 | 17.687 |
| Example 11 | 2.422 | 79.215 | 17.883 |
| Example 12 | 2.281 | 79.516 | 17.959 |
| Example 13 | 2.575 | 78.846 | 17.770 |
| Example 14 | 2.404 | 79.218 | 17.890 |
| Example 15 | 2.293 | 79.460 | 17.942 |
| Example 16 | 2.626 | 78.651 | 17.717 |
| Example 17 | 2.371 | 79.257 | 17.899 |

TABLE 8

| | Series resistance (Rs; mΩ) | Fill factor (FF; %) | Conversion efficiency (%) |
|---|---|---|---|
| Example 18 | 2.300 | 79.449 | 17.936 |
| Example 19 | 2.617 | 78.681 | 17.736 |
| Example 20 | 2.545 | 78.939 | 17.822 |
| Example 21 | 2.651 | 78.496 | 17.673 |
| Example 22 | 2.344 | 79.300 | 17.916 |
| Example 23 | 2.129 | 79.605 | 17.978 |
| Example 24 | 2.564 | 78.869 | 17.785 |
| Example 25 | 2.512 | 79.006 | 17.865 |
| Example 26 | 2.320 | 79.386 | 17.929 |
| Example 27 | 2.624 | 78.660 | 17.734 |
| Example 28 | 2.717 | 78.310 | 17.628 |
| Example 29 | 2.550 | 78.883 | 17.807 |
| Example 30 | 2.542 | 78.969 | 17.831 |
| Example 31 | 2.674 | 78.432 | 17.639 |
| Example 32 | 2.526 | 78.989 | 17.843 |
| Example 33 | 2.516 | 79.001 | 17.861 |
| Comparative Example 1 | 3.842 | 77.086 | 17.136 |
| Comparative Example 2 | 3.296 | 77.545 | 17.354 |

The compositions prepared in Examples 1 to 33 included the silver derived from the silver compound having an ionic dissociation temperature of about 1,100° C. or less, the molar ratio of Ag:Te was in a range of about 1:0.1 to about 1:50, and the molar ratio of Ag:Li, Na, or K was in a range of about 1:0.01 to about 1:10.

As seen from the results listed in Tables 7 and 8, it could be seen that the electrodes prepared using the compositions for forming a solar cell electrode, which included the glass frit, prepared in Examples 1 to 33 had lower series resistance values and superior conversion efficiency and fill factor values, compared to the electrodes prepared in Comparative Examples 1 and 2.

By way of summation and review, electrodes of the solar cells may be formed by coating a wafer or substrate with a composition for forming a solar cell electrode, and patterning and baking the composition. It is desired that emitters be made thinner to enhance efficiency of the solar cells. However, as the emitters get thinner, a shunting phenomenon, which decreases the performance of the solar cells, may result. Also, the area of the solar cells tends to increase in order to improve the photoelectric conversion efficiency. In this case, however, the efficiency of the solar cells may be reduced due to an increase in contact resistance of the solar cells. Therefore, it is desirable to develop a composition for forming a solar cell electrode, which may be used to manufacture thinner emitters by improvement of contact characteristics with the wafer, such that conversion efficiency may be enhanced by minimizing the contact resistance (Rc) and the series resistance (Rs).

As described above, a solar cell electrode prepared using a composition according to an embodiment may exhibit excellent fill factor and conversion efficiency due to the minimized contact resistance (Rc) and series resistance (Rs).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or described in connection with a particular embodiment may be used singly or in combination with features, characteristics, and/or described in connection with other embodiments unless otherwise specifically indicated. Accordingly, it will be understood by those of skill in the art that various changes in form and details may be made without departing from the spirit and scope as set forth in the following claims.

What is claimed is:

1. A composition for forming a solar cell electrode, the composition comprising:
a silver powder, a glass frit, and an organic vehicle, wherein:
the glass frit includes silver, tellurium, and one or more of lithium, sodium, or potassium,
a molar ratio of silver:tellurium in the glass frit is about 1:0.1 to about 1:50, and
a molar ratio of silver:lithium, sodium, or potassium in the glass frit is about 1:0.01 to about 1:10,
wherein silver in the glass frit is formed from one or more of silver cyanide, silver nitrate, a silver halide, silver carbonate, silver acetate, or silver sulfate, and
wherein the glass frit generates silver crystals in response to baking the composition for forming a solar cell electrode.

2. The composition as claimed in claim 1, wherein the glass frit further includes one or more of lead, bismuth, phosphorus, germanium, gallium, cerium, iron, silicon, zinc, tungsten, magnesium, cesium, strontium, molybdenum, titanium, tin, indium, vanadium, ruthenium, barium, nickel, copper, arsenic, cobalt, zirconium, manganese, neodymium, chromium, antimony, or aluminum.

3. The composition as claimed in claim 1, wherein the glass frit includes silver at about 0.1 mol % to about 65 mol %, based on the total moles of the glass frit.

4. The composition as claimed in claim 1, wherein the glass frit is formed from a metal precursor that includes:
the one or more of silver cyanide, silver nitrate, a silver halide, silver carbonate, silver acetate, or silver sulfate;
tellurium oxide; and
a compound including one or more of lithium, sodium, or potassium.

5. The composition as claimed in claim 4, wherein the metal precursor further includes one or more of lead oxide, bismuth oxide, phosphorus oxide, germanium oxide, gallium oxide, cerium oxide, iron oxide, silicon oxide, zinc oxide, tungsten oxide, magnesium oxide, cesium oxide, strontium oxide, molybdenum oxide, titanium oxide, tin oxide, indium oxide, vanadium oxide, ruthenium oxide, barium oxide, nickel oxide, copper oxide, arsenic oxide, cobalt oxide, zirconium oxide, manganese oxide, neodymium oxide, chromium oxide, antimony oxide, or aluminum oxide.

6. The composition as claimed in claim 4, wherein the metal precursor includes:

about 1 wt % to about 45 wt % of the one or more of silver cyanide, silver nitrate, a silver halide, silver carbonate, silver acetate, or silver sulfate, about 20 wt % to about 75 wt % of the tellurium oxide, and about 1 wt % to about 35 wt % of the compound including one or more of lithium, sodium, or potassium.

7. The composition as claimed in claim 5, wherein the metal precursor includes about 1 wt % to about 40 wt % of the one or more of lead oxide, bismuth oxide, phosphorus oxide, germanium oxide, gallium oxide, cerium oxide, iron oxide, silicon oxide, zinc oxide, tungsten oxide, magnesium oxide, cesium oxide, strontium oxide, molybdenum oxide, titanium oxide, tin oxide, indium oxide, vanadium oxide, ruthenium oxide, barium oxide, nickel oxide, copper oxide, arsenic oxide, cobalt oxide, zirconium oxide, manganese oxide, neodymium oxide, chromium oxide, antimony oxide, or aluminum oxide.

8. The composition as claimed in claim 1, wherein the composition includes:

about 60 wt % to about 95 wt % of the silver powder;
about 0.1 wt % to about 20 wt % of the glass frit; and
about 1 wt % to about 30 wt % of the organic vehicle.

9. The composition as claimed in claim 1, wherein the glass frit has an average particle size (D50) of about 0.1 μm to about 10 μm.

10. The composition as claimed in claim 1, further comprising one or more of a dispersing agent, a thixotropic agent, a plasticizing agent, a viscosity stabilizing agent, an antifoaming agent, a pigment, a UV stabilizer, an antioxidant, or a coupling agent.

11. A solar cell electrode prepared using the composition as claimed in claim 1, wherein the solar cell electrode includes the silver crystals.

12. A method of fabricating a solar cell, the method comprising:

applying the composition as claimed in claim 1 on a substrate for a solar cell; and forming a solar cell electrode on the substrate, forming the solar cell electrode including firing the substrate having the composition applied thereon.

13. The composition as claimed in claim 1, wherein the glass frit includes silver, tellurium, and one or more of sodium or potassium.

14. A composition for forming a solar cell electrode, the composition comprising:

a silver powder, a glass frit, and an organic vehicle, wherein:

the glass frit includes silver, tellurium, and one or more of sodium or potassium, a molar ratio of silver:tellurium in the glass frit is about 1:0.1 to about 1:50, and a molar ratio of silver:sodium or potassium in the glass frit is about 1:0.01 to about 1:10, wherein silver in the glass frit is formed from one or more of silver cyanide, silver nitrate, a silver halide, silver carbonate, silver acetate, or silver sulfate, and wherein the glass frit generates silver crystals in response to baking the composition for forming a solar cell electrode.

* * * * *